US008713519B2

(12) United States Patent
Lininger (10) Patent No.: US 8,713,519 B2
(45) Date of Patent: Apr. 29, 2014

(54) METHOD FOR IMPROVING THE PERFORMANCE OF BROWSER-BASED, FORMULA-DRIVEN PARAMETRIC OBJECTS

(75) Inventor: Scott Lininger, Lafayette, CO (US)

(73) Assignee: Trimble Navigation Ltd., Sunnyvale, CA (US)

( * ) Notice: Subject to any disclaimer, the term of this patent is extended or adjusted under 35 U.S.C. 154(b) by 182 days.

(21) Appl. No.: 13/197,976

(22) Filed: Aug. 4, 2011

(65) Prior Publication Data

US 2013/0036401 A1 Feb. 7, 2013

(51) Int. Cl.
*G06F 9/44* (2006.01)

(52) U.S. Cl.
USPC .......................................... 717/109; 717/100

(58) Field of Classification Search
USPC ........................................................ 717/109
See application file for complete search history.

(56) References Cited

U.S. PATENT DOCUMENTS

| 6,912,293 | B1 * | 6/2005 | Korobkin ...................... 382/100 |
| 7,096,465 | B1 | 8/2006 | Dardinski et al. |
| 7,561,164 | B2 * | 7/2009 | Baumberg .................... 345/582 |
| 7,810,025 | B2 | 10/2010 | Blair et al. |
| 8,229,715 | B1 * | 7/2012 | Teller et al. ...................... 703/1 |
| 2006/0043264 | A1 * | 3/2006 | Sakurai ...................... 250/208.1 |
| 2010/0149091 | A1 | 6/2010 | Kota et al. |
| 2010/0149189 | A1 | 6/2010 | Kota et al. |
| 2010/0149192 | A1 | 6/2010 | Kota et al. |
| 2010/0149215 | A1 * | 6/2010 | Kota et al. ...................... 345/643 |
| 2010/0153692 | A1 | 6/2010 | Kota et al. |
| 2010/0321391 | A1 | 12/2010 | Rubin et al. |
| 2010/0321407 | A1 * | 12/2010 | Mital et al. .................... 345/643 |
| 2012/0323535 | A1 * | 12/2012 | Teller et al. ...................... 703/1 |
| 2013/0036401 | A1 * | 2/2013 | Lininger ...................... 717/109 |

OTHER PUBLICATIONS

Berndt et al., Applicant Supplied Prior Art, IDS Aug. 4, 2011 NPL Reference (Published 2009).*
Berndt et al., "3D Modeling in a Web Browser to Formulate Content-Based 3D Queries," Web 3D 2009 Proceedings of the 14th International Conference on 3D Web Technology, 2009, 8 pages.

* cited by examiner

*Primary Examiner* — Don Wong
*Assistant Examiner* — Theodore Hebert
(74) *Attorney, Agent, or Firm* — Sheridan Ross P.C.

(57) ABSTRACT

A computer-aided, design system and method generates procedural code from a plurality of spreadsheet formulas which define the behavior of a parametric object. These spreadsheet formulas drive function calls to an API of the design system when initially drawing the parametric object within a user interface, and these function calls may be cached as procedural code. In subsequent re-drawings of same object, the procedural code may be executed with updated or changed attributes received from an input dialog box. Rather than converting, translating, and parsing the spreadsheet formulas each time an entry is changed, the procedural code may be optimized for execution and also be concealed from the user so that any proprietary information in the formulas and functions is kept secret.

20 Claims, 6 Drawing Sheets

METHOD FOR IMPROVING THE PERFORMANCE OF BROWSER-BASED, FORMULA-DRIVEN PARAMETRIC OBJECTS

FIELD OF TECHNOLOGY

The present disclosure relates generally to a browser-based formula parsing method and more specifically to a system and a method configured to parse the string formulas of a web-based user environment into fast, secure code that may be run within the browser to improve performance of calculations while concealing the formula code.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Graphic components displayed and edited within a computer-aided design system may include named values (i.e., parameters) and formulas that consume the parameters to calculate new values and drive behaviors of a user interface ("UI"). For example, a computer-aided design system may include a familiar spreadsheet or other interface that includes parameters describing basic measurements (e.g., Length=5, Width=5) associated with graphic components, as well as formulas that define relationships between parameters (e.g., Area=Length×Width). Systems that include parameters associated with components and formulas to consume the parameters may generally be described as "parametric." Web-based parametric systems associated with consumer products may include interfaces related to furniture, shelving lines, storage systems, cabinetry, computer hardware, etc. Such systems may allow a user to configure parameters in a web-based shopping or design environment (e.g., material thickness, overall object height or width, type of random access memory (RAM), etc.) where a change of one parameter affects other parameters (e.g., changing the height of a bookshelf may not only change the dimensions of the bookshelf, but also the number of shelves).

In addition to the parameters, formulas to configure the goods may also be changed resulting in commensurate changes to the end product. For example, a design system may employ a spreadsheet interface to simplify changing the behavior of a graphic component for users that are unfamiliar with computer programming. In the spreadsheet interface, the user may enter familiar spreadsheet-style formulas to create complex and powerful behaviors in the graphic components, which may be 3D objects representing consumer goods, for example. As another example, a costing spreadsheet may take a number of user options and generate a price for a consumer good. A configurable consumer product such as a desk may have a complicated pricing formula involving dozens of options, hundreds of parts, dimensions, and associated costs such as labor, packaging, shipping, regional availability, sales tax tables, etc. Often, the formulas of these pricing sheets are confidential sales tools or trade secrets that are protected from public disclosure.

While parametric systems with spreadsheet interfaces may be relatively easy to use, performance issues in implementing user parameters and formulas increases as the complexity of the parametric system increases. For example, each time that a formula or parameter is modified within a spreadsheet or other interface, the parametric system must translate the entry into a usable type (e.g., from String to Integer), parse the entry to determine the user's intent and the formula's yield, as well as report any feedback or errors.

For instance, in current parametric systems, a user enters parameters and formulas in a user interface such as the cells of a spreadsheet as in Table 1, below. If the user changes the value for Width, past parametric systems translated the input from a String type to an Integer or other numeric type, converted the units for Width (e.g., from metric to English, from meters to centimeters, etc.), parsed the formulas for Volume from String type into computer operations, executed the parsed formulas, translated the formula results back to String types, and updated the UI. Even in trivial examples, this process may be computationally expensive and slow.

TABLE 1

| Width | Height | Depth | Volume |
|---|---|---|---|
| 100 m | 100 m | 100 m | VOLUME_IN_METERS is "=((parseLengthString(Width)*parseLengthString(Height)*parseLengthString(Depth)) & 'm'" VOLUME_IN_CM is "=round(parseLengthString(VOLUME_IN_METERS)*(100*100), 1) & 'cm'" |

SUMMARY

Rather than converting, translating, and parsing the user-configurable entries in parametric system each time an entry is changed, formulas of a String type may be compiled into a script, such as JavaScript® code, that can be run in a browser. The formulas may then be optimized for execution within the browser and also be concealed from the user so that any proprietary information is kept secret.

A computer-implemented method or a computer system or a computer-readable medium storing a set of instructions for execution on a processor operates to generate procedural code from a plurality of function calls to an API of a design system when initially drawing a parametric object within a user interface. In subsequent re-drawings of the same object, the method, system or instructions executes the procedural code with updated or changed attributes. In some embodiments, a computer-implemented method or a computer system or a computer-readable medium storing a set of instructions for execution on a processor operates to receive an attribute for a formula of the parametric object that uses the attribute, the attribute in a first format, converts the received attribute and the formula to a second format corresponding to a function parameter of the design system, initially draws the parametric object within the graphical user interface of the design system by calling a function corresponding to the function parameter of the design system and passing one or more of the converted attribute and the converted formula to the function as the function parameter, generates procedural code from the function call, and uses the attribute to determine an appearance of the parametric object within a graphical user interface of the design system. Further, when the method, system, or instructions for execution on a processor operate to receive an updated attribute, if the parametric object includes the procedural code, the object is re-drawn within the graphical user interface of the design system by executing the procedural code using the updated attribute, and the updated attribute is used to determine a new appearance of the parametric object within the graphical user interface of the design system.

The method, system, or instructions may also translate the attribute and formula into a plurality of parameters corresponding to the API of the design system when generating the procedural code. Furthermore, the formula of the object may be translated into a script variable that uses an inherited function of the API while an attribute of the object may be translated into a parameter list for a function of the API. The API functions may generally correspond to a position of a plurality of sub-objects within the graphical user interface of the design system.

In some embodiments, the design system includes an input dialog module that receives an attribute for a formula of the parametric object. The design system may then graphically process the parametric objects a first time by translating the parametric object formulas into a plurality of function calls corresponding to functions of the API and then pass the received attribute to the plurality of functions as a function parameter. A formula parser module may then generate procedural code from the plurality of calls to the API functions by caching each function call. Upon re-drawing or refreshing the object, the three-dimensional modeling module may graphically process the parametric objects by executing the cached function calls using an updated attribute.

The features and advantages described in this summary and the following detailed description are not all-inclusive. Many additional features and advantages will be apparent to one of ordinary skill in the art in view of the drawings, specification, and claims hereof. Additionally, other embodiments may omit one or more (or all) of the features and advantages described in this summary.

DETAILED DESCRIPTION

Generally speaking, an optimized parametric system and method of parametric object optimization converts the attributes and formulas of a web-based parametric object into an internal instruction set. This instruction set may then be executed using an interpreted language (e.g., JavaScript®) whenever the object is modified. The object itself may parse each parameter and formula to a script that may be interpreted. In some embodiments, the parametric system may utilize a web-browser, and the converted instruction set may be executed within the web browser using the interpreted language.

Figure 1:
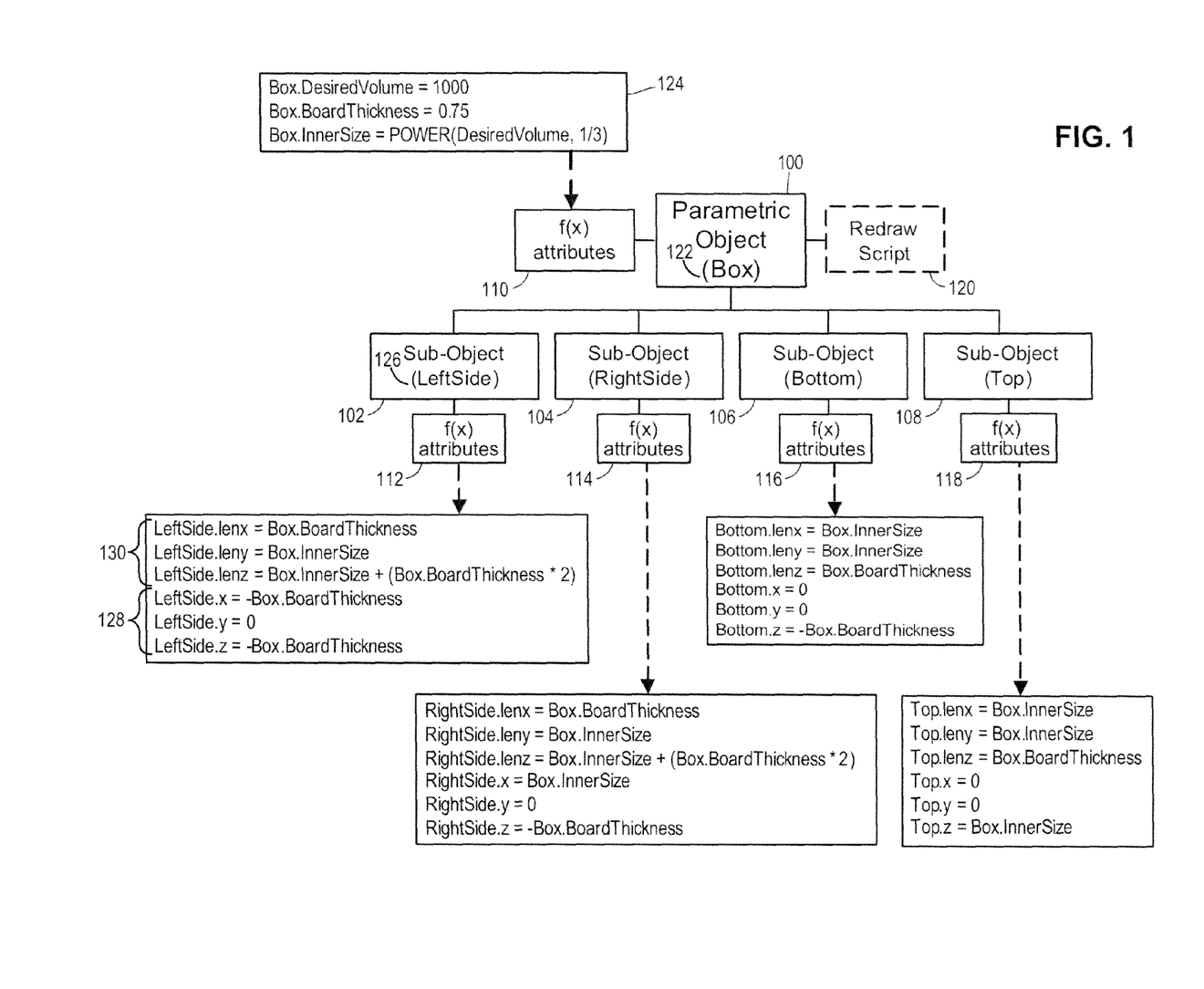
FIG. 1 is a high-level block diagram of a parametric object having formulas and attributes that determine the behavior of sub-objects in a computer-aided, three-dimensional modeling and design system as the sub-objects are modified within a graphical user interface of the system.

FIG. 1 is a high-level block diagram that illustrates a parametric object 100 that may be used in a computer-aided design system. A parametric object 100 may be a group of geometry (edges and faces) displayed within a graphical user interface, for example, a user interface for a computer-aided, two-dimensional design system or a three-dimensional modeling and design system. The parametric object 100 may include several sub-objects 102, 104, 106, and 108. The object 100 may also include formulas and attributes 110 that may be configured by a user when creating the object 100 or when using the object 100 within a design or design/modeling system. The formulas may include instructions that use the attributes to determine the appearance and illustrate behavior of the object 100. Similarly, each sub-object 102, 104, 106, 108 may include formulas and attributes 112, 114, 116, 118, that determine the respective appearance and behavior of the sub-objects. In some embodiments, the formulas and attributes of the object 100 and sub-objects 102, 104, 106, 108 interact to determine the appearance and behavior of the object as a whole. For example, parametric object 100 may be "scaled" by a user to change the overall size of the object 100 within a user interface of a design or design/modeling system. The formulas and attributes of the scaled object may interact such that the resulting object exhibits behaviors that are consistent with a real-world example of the scaled object. For instance, if an object representing a bookcase is scaled to be larger, the distance between shelves may be maintained and additional shelves may be included, the edge thickness of bookcase and shelves may be maintained, etc.

Figure 2A:
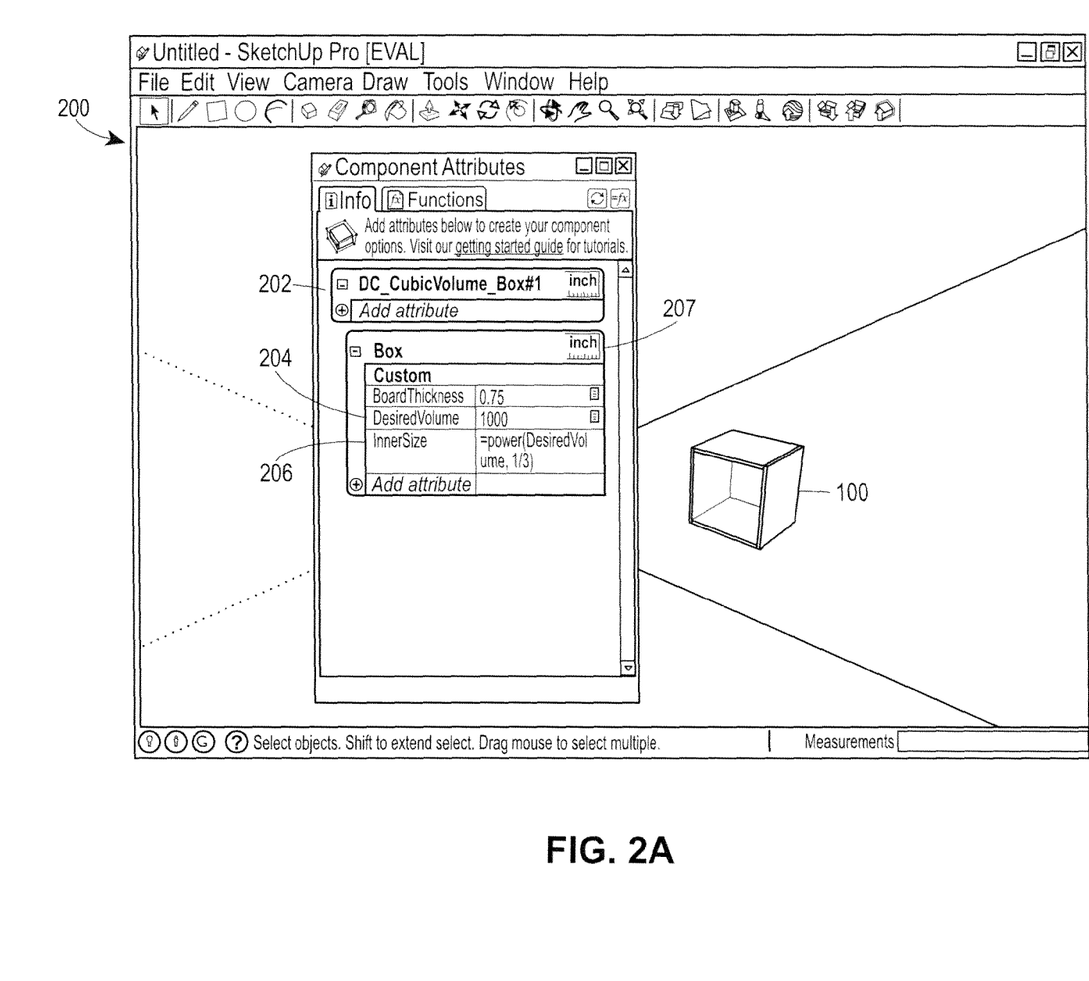
FIGS. 2A and 2B are exemplary graphical user interfaces of a computer-aided, three-dimensional modeling and design system during modification of a parametric object.
Figure 2B:
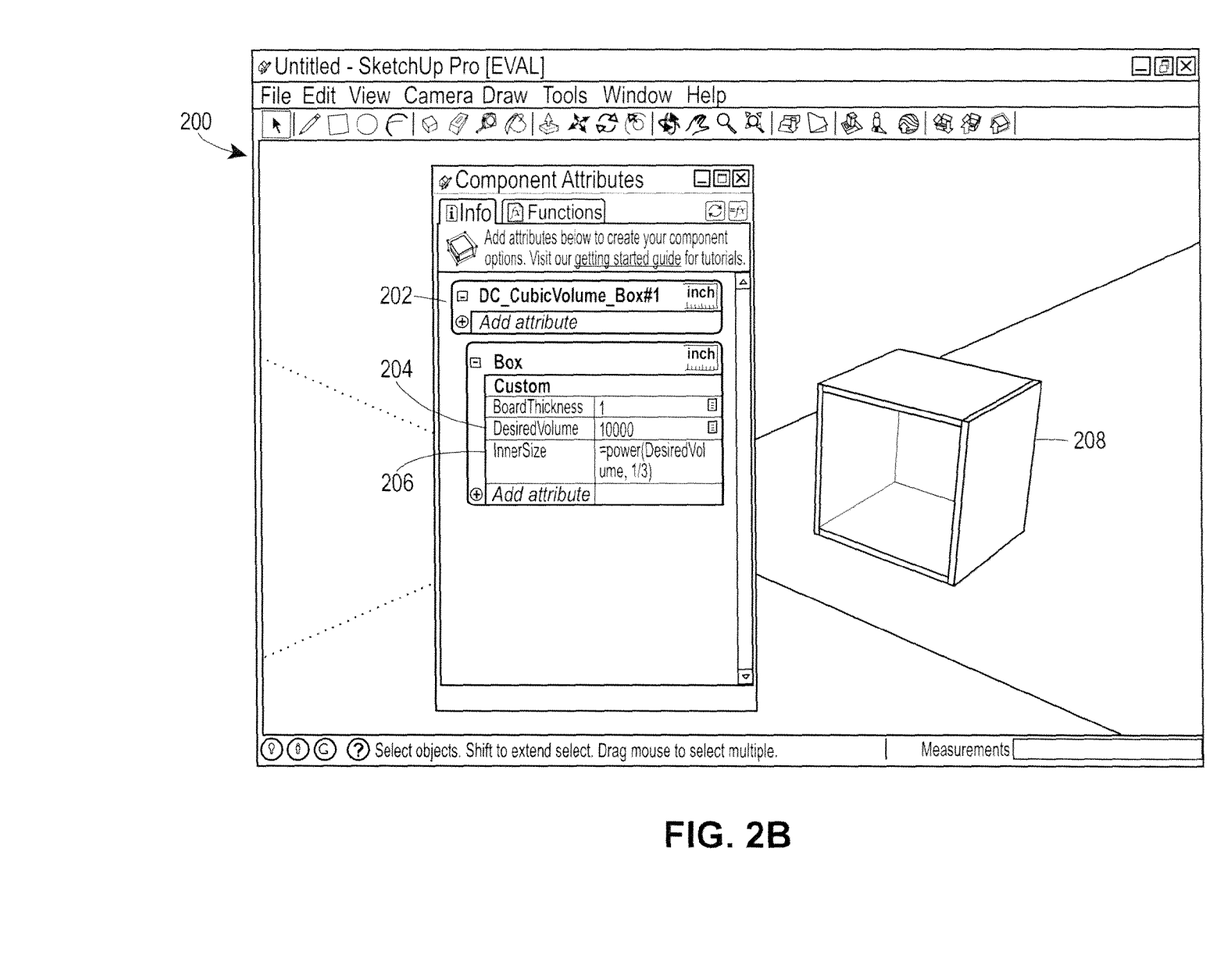

With reference to FIGS. 1 and 2A, one embodiment of a parametric object 100 may illustrate a four-sided box object 100 including left, right, top and bottom faces that change dimensions to surround a user-specified volume of space, as displayed within a user interface 200 of a three-dimensional modeling system. As known, the volume of a cube may be expressed as the product of its length, width, and height. Conversely, the length, width, and height of a cube having a known volume may be described as the volume raised to the power of ⅓ or $vol^{1/3}$. Where each side of the cube also includes a width, such as the sub-objects 102, 104, 106, and 108 of the box parametric object 100, the box length, width, and height may be described in relation to the side thickness. A dialog box 202 may allow the three-dimensional modeling system to receive various values for attributes 204 and formulas 206 of the object 100. Thus, when a user defines a desired volume attribute 204, then each attribute and formula of sub-objects 102, 104, 106, and 108 that includes the desired volume attribute 204 may be re-calculated. Table 2 illustrates one example of calculations for the formulas and attributes 112 of a sub-object 102 that may be performed in response to defining an attribute (e.g., DesiredVolume) for the box object 100. Changing the attribute 204 or formula 206 may initiate a method to refresh or rescale the object 100 according to the changed value of the attribute 204 or formula 206. As shown in Table 2 and between FIGS. 2A and 2B, a change of the DesiredVolume attribute 204 may increase the dimensions of each sub-object 102, 104, 106, and 108 (and thus, the box 100) according to formulas defined for the object and sub-objects. The complexity of the object increases as the number of sub-objects associated with each object increases. For example, the number of operations that must be performed to initially draw or scale an object increases as the number of sub-objects associated with each object increases.

TABLE 2

|  | Attribute/Formula | Value |
|---|---|---|
| Object (Box) | Box.DesiredVolume | 1000 |
|  | Box.BoardThickness | 0.75 |
|  | Box.InnerSize = POWER(DesiredVolume, ⅓) | 10 |
| Sub-Object (Left Side) | LeftSide.lenx = Box.BoardThickness | 0.75 |
|  | LeftSide.leny = Box.InnerSize | 10 |
|  | LeftSide.lenz = Box.InnerSize + (Box.BoardThickness * 2) | 20 |
|  | LeftSide.x = −Box.BoardThickness | −0.75 |
|  | LeftSide.y = 0 | 0 |
|  | LeftSide.z = −Box.BoardThickness | −0.75 |

A three-dimensional modeling system for displaying and editing parametric objects 100 may execute a method to generate procedural code from spreadsheet-style formulas that, when executed, drive initial function calls to draw a parametric object 100 within a user interface. In some embodiments, subsequent execution of this procedural code redraws the object 100 without re-executing each operation (e.g., each conversion and translation operation of the attributes and formulas 112, 114, 116, and 118) that is necessary to initially draw the object.

Figure 3:
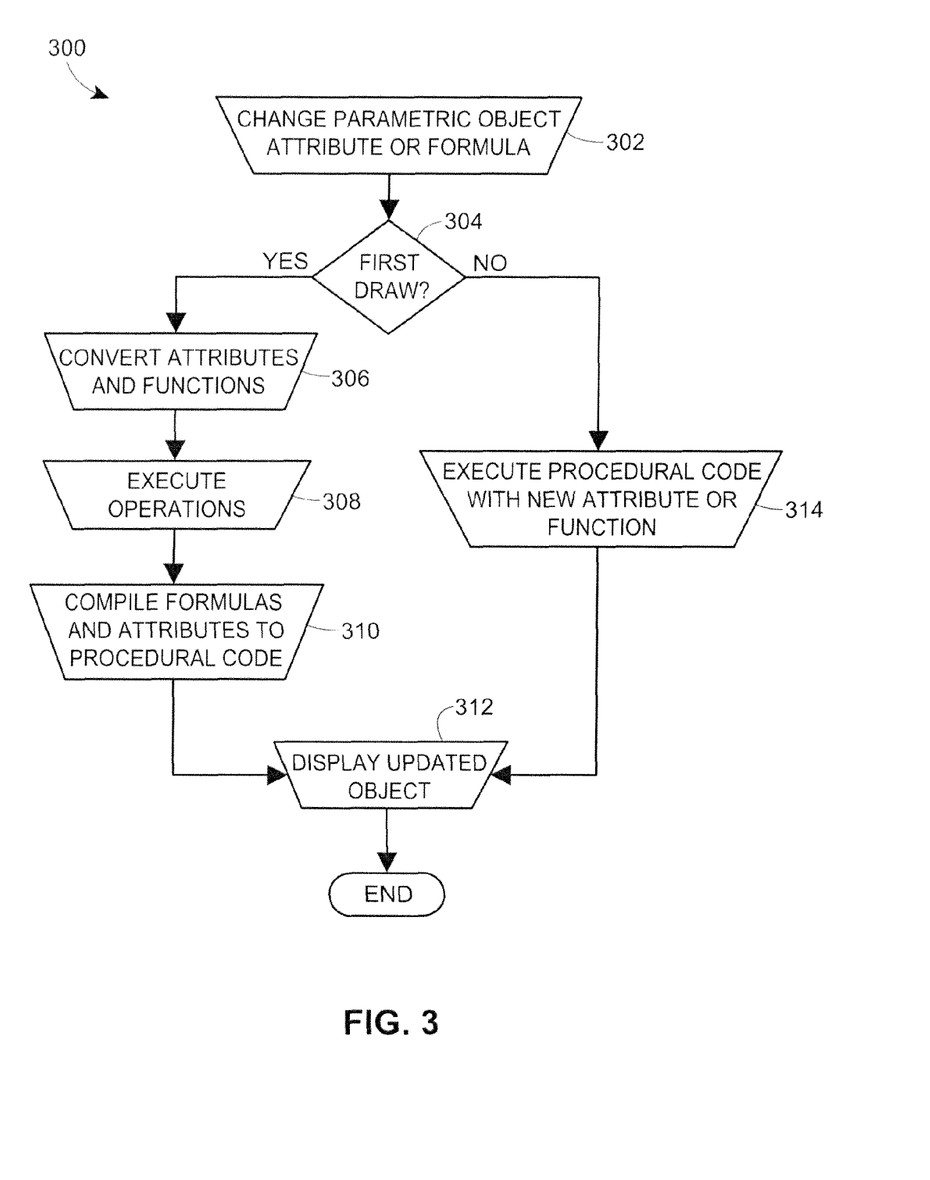
FIG. 3 is an exemplary block diagram of a method for compiling the formulas and attributes of a parametric object to procedural code.

FIG. 3 is a flow diagram of an example method 300 for compiling the formulas and attributes of a parametric object 100 into procedural code to reduce the number of operations performed by the system when re-drawing or re-scaling the object 100. The method 300 may include one or more blocks, modules, functions or routines in the form of computer-executable instructions that are stored in a tangible computer-readable medium and executed using a processor of a computing device (e.g., a computing device of a three-dimensional modeling system, as described herein). The method 300 may be included as part of any of modules of a computing environment for a three-dimensional modeling system, for example, or as part of a module that is external to such a system. For example, the method 300 may be part of a formula parser module executing within a three-dimensional modeling application on a computing device of a three dimensional modeling system. FIG. 3 will be described with reference to FIGS. 1 and 2A for ease of explanation, but the method 300 can of course be utilized with other objects and user interfaces.

At block 302, the three-dimensional modeling system and formula parser may execute an instruction to change or receive an attribute or formula 110 of a parametric object 100. A dialog box 202 may facilitate receiving the attribute or formula 110 or a new or changed attribute or formula 110 by displaying an input box for both an attribute 204 and a formula 206 in a spreadsheet, table, or other suitable interface. As illustrated by FIG. 2, the formula 206 may be displayed in the interface in a familiar, spreadsheet style (i.e., "=power (DesiredVolume, ⅓)"). The attributes and formulas 110 may be updated automatically through another interface with the three-dimensional modeling system.

At block 304, the three-dimensional modeling system and formula parser may execute an instruction to determine if the object 100 has been previously drawn. In some embodiments, block 304 may determine if the object 100 includes a redraw script 120 or other set of instructions to redraw the object.

If the object 100 does not include a redraw script 120, then the computing device may execute an instruction to convert (block 306) the data received in the input boxes 204 and 206 to a format that is usable during execution of the various attributes and formulas 110, 112, 114, 116, and 118 to initially draw the object 100 within the user interface 200. For example, the system or dialog box 202 may receive all data from the input boxes 204 and 206 in a first format such as a String type. However, when the three-dimensional modeling system and formula parser execute the attributes and formulas 110, 112, 114, 116, and 118 during a redraw operation, the attributes and formulas may only accept a second format, such as an Integer or other data type. Further, the other attributes and formulas of the object 100 may only recognize Integer or other types of data. In some embodiments, a web browser-based dialog box (e.g., dialog box 202) interprets any entry within the input dialog boxes 204, 206 as a String. Thus, the step 306 may convert all String type input box entries 204, 206 received by step 302 into Integer or other types that may be used by various attributes and formulas 110, 112, 114, 116, and 118 to draw the object 100 in the user interface 200.

Further, block 306 may execute an instruction to convert the units of the received inputs 204 and 206 to be compatible with the attributes and formulas 110, 112, 114, 116, and 118 of the object 100 and sub-objects 102, 104, 106, and 108. For example, the object 100 may include attributes and formulas for values in inches, but the dialog box 202 may include a conversion button 207 to execute an instruction which converts an input box entry 204, 206 into another unit of measurement. For example, block 302 may receive values in inches, but selecting a conversion button may convert the value to another unit of measure. Where units of the input received at block 302 are converted by an instruction initiated by the conversion button 207, block 306 executes further instructions to ensure that the input 204, 206 is compatible with the attributes and formulas 110, 112, 114, 116, and 118 of the object 110 and sub-objects 102, 104, 106, and 108.

Still further, block 306 may execute an instruction to check the received input 204 and 206 for errors. As described above, block 302 may interpret received inputs as a String type, but require an Integer type. However, block 302 may receive a String type input when expecting an Integer (e.g., block 302 may receive the letter "A" when the object's attributes and formulas 110 require an Integer). Thus, block 306 may execute an instruction to determine if block 302 received an input that was unexpected or in error.

At block 308, the computing device may execute operations to initially draw the object 100 within the user interface 200 using the input (e.g., inputs 204 and 206) received at block 302 and the attributes and formulas 110, 112, 114, 116, and 118. In some embodiments, block 308 may read the spreadsheet-style formula 206 and initiate calls to an API for a three-dimensional modeling and design system using that spreadsheet formula 206 to initiate functions to update each attribute and formula 110 of the object 100 using the data received at block 302. In general, the API may describe a particular set of rules and specifications to access and use the services and resources provided by the three-dimensional modeling and design system. In some embodiments, the API describes functions for scaling a parametric object within a user interface so that particular sub-objects are re-sized differently or according to particular rules for that object. For example, where the object is a box having a fixed volume, the sub-object box sides may include functions that re-size the sides to maintain that fixed volume. Further, the API may include functions describing pricing or other characteristics of the object. For example, a set of shelves may be configurable by input dialog boxes within a user interface to include any number of shelves, a user-defined length or height, or other design features. Each one of these features may include its own pricing function such that, once the shelves are re-sized or re-configured, an updated price may also be calculated.

Using the spreadsheet-style formula 206 to drive execution of the function calls may update the attributes and formulas 112, 114, 116, and 118 of the sub-objects 102, 104, 106, and 108. These calls may correspond to the placement of various graphic elements of the sub-object 102, 104, 106, and 108 within a user interface 200 of the three-dimensional modeling system, pricing, or other object functions as generally described above. The API may include various functions and methods to place sub-object graphic elements in the user interface 200, price the various sub-objects or other components in a re-scaled or re-sized object 100, or other functions and methods. The calls may execute functions and methods representing attributes and functions for both and object 100 and sub-objects 102, 104, 106, and 108 as illustrated in FIG. 1 and as shown above in Table 2. To draw the object 100 using the input received at block 302, block 308 may initiate calls to functions and methods by passing the received input 204, 206 to the API. For example, block 308 may execute a function "redrawBox(desiredVolume)" by passing the value of "1000" for the "desired Volume" parameter to the function. The "redrawBox" function may then execute a plurality of methods to reconfigure and present the updated object 100 within the user interface 200.

Figure 4:
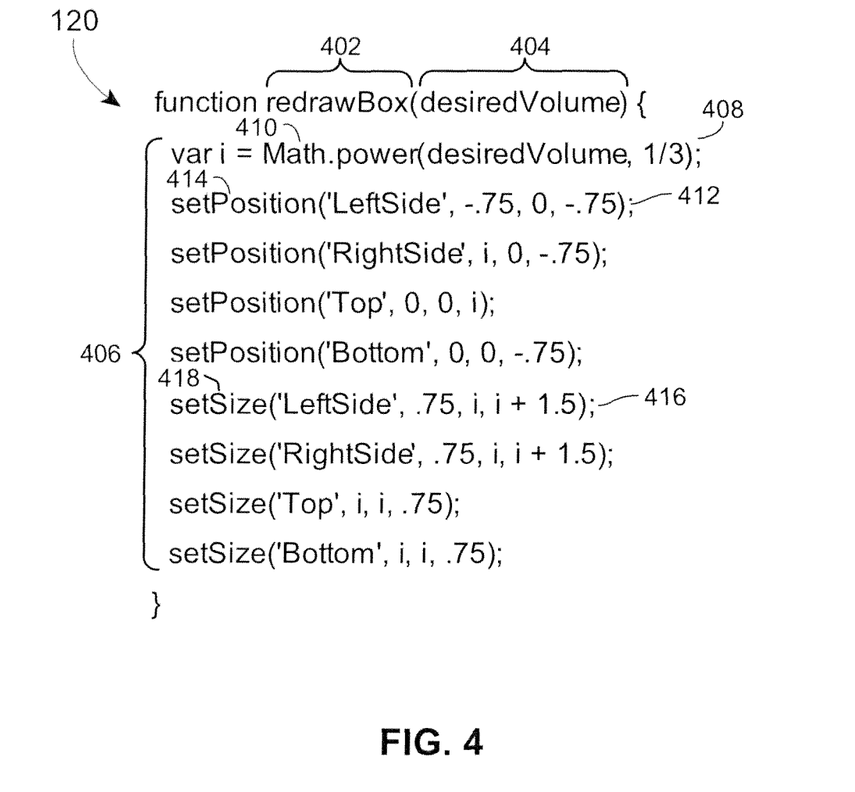
FIG. 4 is one example of procedural code generated according to the exemplary method of FIG. 3.

At block 310, the computing device may execute operations to compile the formulas and methods of the API that were called by block 308 to initially draw the object 100 in the user interface 200. In some embodiments, block 310 may compile the function calls into procedural code, for example, a redraw script 120 (FIGS. 1 and 4). Block 310 may detect and cache each function call initiated by operations that are executed at block 308 to initially draw the object 100 and create various procedural operations using the formulas and attributes 110 of the object 100 as well as the formulas and attributes 112, 114, 116, and 118, of the sub-objects 102, 104, 106, and 108.

With reference to FIG. 4, the redraw script 120 created at block 310 may include a Javascript® function to replicate the function calls. As illustrated by FIG. 4, the redraw script 120 may include a series of computational steps to mimic the operations that were executed to initially draw the object 100 within the user interface 200 (i.e., block 308). The redraw script may include a function name 402, function parameter list 404, function body 406, as well as various methods and procedures inherited from the design system API. In some embodiments, block 310 may compile the attributes and formulas 110, 112, 114, 116, and 118 into the redraw script 120 by translating the calls into various portions of the script 120. For example, block 310 may translate the attributes and formulas 110, 112, 114, 116, and 118 into parameters used in function calls to the three-dimensional modeling system when the object 100 was initially drawn at block 308. Further, block 310 may concatenate a name 122 of the object 100 onto a name 402 of the redraw script 120 and insert the name of a user-configurable object attribute 124 into a parameter list 404 of the script 120. In the body 406 of the script 120, block 310 may translate a formula 206 of the object 100 into a script variable 408 that uses an inherited function or class of functions 410 of the API. Block 310 may also translate the attributes and formulas 112, 114, 116, 118 of the sub-objects 102, 104, 106, 108 into various parameter lists for other function calls. For example, block 310 may pass a sub-object name 126 and initial "x, y, and z" coordinate positions 128 as a parameter list 412 for a "setPosition" function 414. Further, block 310 may pass a sub-object name 126 and initial "length along x, y, and z" parameters 130 as another parameter list 416 for a "setSize" function 418 of the API. Of course, block 310 may cache any other function calls and compile a script 120 or other procedural code. After initially converting and executing the attributes 204 and formulas 206 as in blocks 306 and 308, the code 120 may be subsequently executed with fewer operations of the computing device. For example, the API may include pricing, color, and other functions that may be re-calculated for display within a user interface 200, a web browser, or other type of display interface, without revealing to a user the particular steps of the functions that are used to re-size or re-price the object. After executing the API functions using the data received at block 302, the updated object 208 may be displayed within the user interface 200 at block 312.

For any subsequent re-scaling or re-drawing of an object 100, the method 300 may execute the script 120 and change the object 100 by passing the changed attribute or formula to the script from the input boxes 204, 206. The method 300 may receive a new attribute or formula for the object at block 302 and determine whether a script 120 has been previously constructed for the object 100 at block 304, as previously described. If the object 100 includes a script 120, then the method passes the new attribute or formula to the script 120 and executes the script 120. By executing the updated script 120 for each subsequent scaling or drawing of the object 100, the method 300 executes fewer operations than an initial drawing of the object 100 that included blocks 306, 308, and 310.

Figure 5:
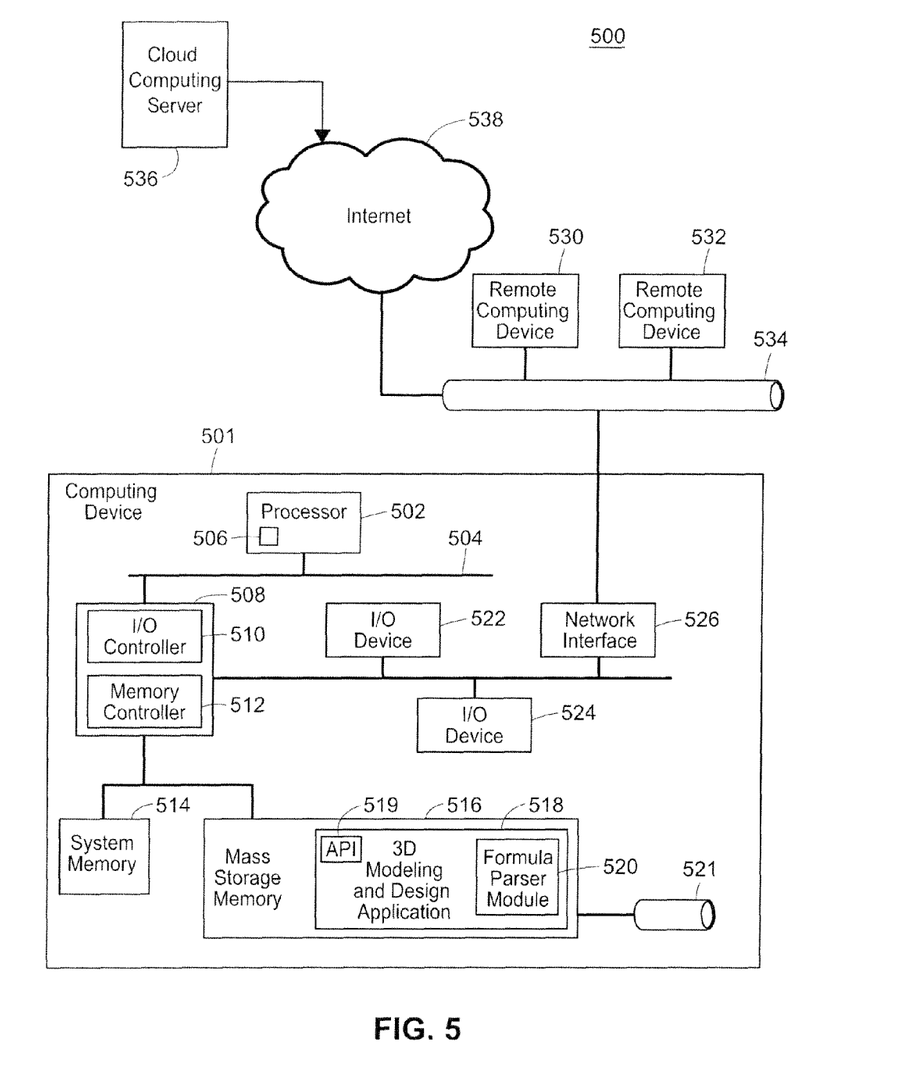
FIG. 5 is high-level block diagram of a computing environment that implements a parametric system that optimizes the configuration and editing of parametric objects within a computer-aided, three-dimensional modeling and design system.

FIG. 5 is a high-level block diagram that of an example computing environment for a three-dimensional modeling system 500 having a computing device 501 that may be used to implement the method 300 for compiling the formulas and attributes of a parametric object 100 into procedural code to reduce the number of operations performed by the system when re-drawing or re-scaling the object 100. The computing device 501 may include a personal computer, thin client, or other known type of computing device. As will be recognized by one skilled in the art, in light of the disclosure and teachings herein, other types of computing devices can be used that have different architectures. Processor systems similar or identical to the example three-dimensional modeling system 500 may be used to implement and execute the example parametric object 100, the user interface 200 and dialog 202 of FIG. 2, the method of FIG. 3, and the script 120 of FIG. 4. Although the example three-dimensional modeling system 500 is described below as including a plurality of peripherals, interfaces, chips, memories, etc., one or more of those elements may be omitted from other example processor systems used to implement and execute the example three-dimensional modeling system 500. Also, other components may be added.

As shown in FIG. 5, the system 500 includes a processor 502 that is coupled to an interconnection bus 504. The processor 502 includes a register set or register space 506, which is depicted in FIG. 5 as being entirely on-chip, but which could alternatively be located entirely or partially off-chip and directly coupled to the processor 502 via dedicated electrical connections and/or via the interconnection bus 504. The processor 502 may be any suitable processor, processing unit or microprocessor. Although not shown in FIG. 5, the system 500 may be a multi-processor system and, thus, may include one or more additional processors that are identical or similar to the processor 500 and that are communicatively coupled to the interconnection bus 504.

The processor 502 of FIG. 5 is coupled to a chipset 508, which includes a memory controller 510 and a peripheral input/output (I/O) controller 512. As is well known, a chipset typically provides I/O and memory management functions as well as a plurality of general purpose and/or special purpose registers, timers, etc. that are accessible or used by one or more processors coupled to the chipset 508. The memory controller 510 performs functions that enable the processor 502 (or processors if there are multiple processors) to access a system memory 514 and a mass storage memory 516.

The system memory 514 may include any desired type of volatile and/or non-volatile memory such as, for example, static random access memory (SRAM), dynamic random access memory (DRAM), flash memory, read-only memory (ROM), etc. The mass storage memory 516 may include any desired type of mass storage device. For example, if the three-dimensional modeling system 500 is used to implement a three-dimensional modeling application 518 having an API 519 and a formula parser module 520 (as described by the method 300 of FIG. 3), the mass storage memory 516 may include a hard disk drive, an optical drive, a tape storage device, a solid-state memory (e.g., a flash memory, a RAM memory, etc.), a magnetic memory (e.g., a hard drive), or any other memory suitable for mass storage. As used herein, the terms module, function, operation, procedure, routine, step, and method refer to computer program logic or computer executable instructions that provide the specified functionality to the computing device. Thus, a module, function, operation, procedure, routine, step, and method can be implemented in hardware, firmware, and/or software. In one embodiment, program modules and routines (e.g., the three-dimensional modeling application 518, the API 519, the formula parser 520, and various parametric objects 100) are stored in mass storage memory 516, loaded into system memory 514, and executed by a processor 502 or can be provided from computer program products that are stored in tangible computer-readable storage mediums (e.g. RAM, hard disk, optical/magnetic media, etc.). Mass storage 516 may also include a database 52) storing a plurality of parametric objects 100 and a database interface module through which the three-dimensional modeling application 518, the API 519, the formula parser 520, etc., may access the parametric objects 100.

The peripheral I/O controller 510 performs functions that enable the processor 502 to communicate with peripheral input/output (I/O) devices 522 and 524 and a network interface 526 via a peripheral I/O bus 528. The I/O devices 522 and 524 may be any desired type of I/O device such as, for example, a keyboard, a display (e.g., a liquid crystal display (LCD), a cathode ray tube (CRT) display, etc.), a navigation device (e.g., a mouse, a trackball, a capacitive touch pad, a joystick, etc.), etc. The I/O devices 522 and 524 may be used with the three-dimensional modeling application 518 and formula parser module 520 to receive attributes and formulas and display user interfaces as described in relation to FIG. 3, above. The network interface 528 may be, for example, an Ethernet device, an asynchronous transfer mode (ATM) device, an 802.11 wireless interface device, a DSL modem, a cable modem, a cellular modem, etc., that enables the three-dimensional modeling system 500 to communicate with another computer system having at least the elements described in relation to the three-dimensional modeling system 500.

While the memory controller 512 and the I/O controller 510 are depicted in FIG. 5 as separate functional blocks within the chipset 508, the functions performed by these blocks may be integrated within a single integrated circuit or may be implemented using two or more separate integrated circuits.

The three-dimensional modeling system 500 may also implement the three dimensional modeling application 518 and formula parser 520 on remote computing devices 530 and 532. The remote computing devices 530 and 532 may communicate with the computing device 501 over an Ethernet link 534. For example, the computing device 501 may receive parametric objects 100 created by a three-dimensional modeling application executing on a remote computing device 530, 532. In other embodiments, the three-dimensional modeling application 518 and/or the formula parser module 520 may be retrieved by the computing device 501 from a cloud computing server 536 via the Internet 538. When using the cloud computing server 536, the retrieved three-dimensional modeling application 518 and/or the formula parser module 520 may be programmatically linked with the computing device 501. The three-dimensional modeling application 518 and/or the formula parser module 520 may be a Java® applet executing within a Java® Virtual Machine (JVM) environment resident in the computing device 501 or the remote computing devices 530, 532. The three-dimensional modeling application 518 and/or the formula parser module 520 may also be "plug-ins" adapted to execute in a web-browser located on the computing devices 501, 530, and 532.

Using the systems and procedures described above, a user can easily redraw or rescale a parametric object 100 without performing conversion and reformatting operations that are required to initially draw the object 100 within a user interface 200. Since this compilation may be done in parallel with the conversion 306 and execution 308 blocks, minimal overhead may be added to the experience of authoring parametric objects 100. The three dimensional modeling system including objects 100 with redraw scripts 120 may perform better or more efficiently.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

For example, the system 500 may include but is not limited to any combination of a LAN, a MAN, a WAN, a mobile, a wired or wireless network, a private network, or a virtual private network. Moreover, while only three remote computing devices 530 and 532 are illustrated in FIG. 5 to simplify and clarify the description, it is understood that any number of client computers are supported and can be in communication within the system 500.

Additionally, certain embodiments are described herein as including logic or a number of components, modules, or mechanisms. Modules may constitute either software modules (e.g., code embodied on a machine-readable medium or in a transmission signal, wherein the code is executed by a processor) or hardware modules. A hardware module is tangible unit capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field programmable gate array (FPGA) or an application-specific integrated circuit (ASIC)) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

Accordingly, the term "hardware module" should be understood to encompass a tangible entity, be that an entity that is physically constructed, permanently configured (e.g., hardwired), or temporarily configured (e.g., programmed) to operate in a certain manner or to perform certain operations described herein. As used herein, "hardware-implemented module" refers to a hardware module. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware modules can provide information to, and receive information from, other hardware modules. Accordingly, the described hardware modules may be regarded as being communicatively coupled. Where multiple of such hardware modules exist contemporaneously, communications may be achieved through signal transmission (e.g., over appropriate circuits and buses) that connect the hardware modules. In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods or routines described herein may be at least partially processor-implemented. For example, at least some of the operations of a method may be performed by one or processors or processor-implemented hardware modules. The performance of certain of the operations may be distributed among the one or more processors, not only residing within a single machine, but deployed across a number of machines. In some example embodiments, the processor or processors may be located in a single location (e.g., within a home environment, an office environment or as a server farm), while in other embodiments the processors may be distributed across a number of locations.

The one or more processors may also operate to support performance of the relevant operations in a "cloud computing" environment or as a "software as a service" (SaaS). For example, at least some of the operations may be performed by a group of computers (as examples of machines including processors), these operations being accessible via a network (e.g., the Internet) and via one or more appropriate interfaces (e.g., application program interfaces (APIs).)

The performance of certain of the operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

Some portions of this specification are presented in terms of algorithms or symbolic representations of operations on data stored as bits or binary digital signals within a machine memory (e.g., a computer memory). These algorithms or symbolic representations are examples of techniques used by those of ordinary skill in the data processing arts to convey the substance of their work to others skilled in the art. As used herein, an "algorithm" is a self-consistent sequence of operations or similar processing leading to a desired result. In this context, algorithms and operations involve physical manipulation of physical quantities. Typically, but not necessarily, such quantities may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "some embodiments" or "an embodiment" means that a particular element, feature, structure, or characteristic described in connection with the embodiment is included in at least one embodiment. The appearances of the phrase "in some embodiments" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the description. This description should be read to include one or at least one and the singular also includes the plural unless it is obvious that it is meant otherwise.

Still further, the figures depict preferred embodiments of a system and a method configured to parse the string formulas of a web-based user environment into fast, secure code that may be run within the browser to improve performance of calculations while concealing the formula code for purposes of illustration only. One skilled in the art will readily recognize from the following discussion that alternative embodiments of the structures and methods illustrated herein may be employed without departing from the principles described herein Upon reading this disclosure, those of skill in the art will appreciate still additional alternative structural and functional designs for a system and a method configured to parse the string formulas of a web-based user environment into fast, secure code that may be run within the browser to improve performance of calculations while concealing the formula code through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A computer-implemented method for generating procedural code from initial function calls, the initial function calls drawing a parametric object within a graphical user interface of a design system and the parametric object including an attribute and a formula using the attribute, the method comprising:
receiving an attribute for a formula of the parametric object using the attribute, the attribute in a first format;
converting the received attribute and the formula to a second format corresponding to a function parameter of the design system;
initially drawing the parametric object within the graphical user interface of the design system by calling a function corresponding to the function parameter of the design system and passing one or more of the converted attribute and the converted formula to the function as the function parameter;
generating procedural code from the function call, wherein generating procedural code comprises compiling at least one of (i) the attribute and (ii) the formula using the attribute, such that the procedural code, when executed, re-draws the parametric object within the graphical user interface of the design system using an updated attribute; and
using the updated attribute to determine an appearance of the parametric object within a graphical user interface of the design system.

2. The method of claim 1, wherein:
if the parametric object includes the procedural code, re-drawing the parametric object within the graphical user interface of the design system by executing the procedural code using the updated attribute; and
using the updated attribute to determine a new appearance of the parametric object within the graphical user interface of the design system.

3. The method of claim 2, wherein re-drawing the parametric object includes executing a plurality of functions corresponding to an API of the design system.

4. The method of claim 3, wherein generating procedural code from the function call includes translating the attribute and formula into a plurality of parameters corresponding to the API of the design system.

5. The method of claim 3, wherein generating procedural code from the function call includes translating the formula of the object into a script variable that uses an inherited function of the API and translating an attribute of the parametric object into a parameter list for a function of the API.

6. The method of claim 1, wherein the function corresponds to a position of a plurality of sub-objects within the graphical user interface of the design system.

7. The method of claim 1, further comprising receiving the attribute from a dialog box of the graphical user interface of the design system, wherein the first format includes a String and the second format includes an Integer.

8. The method of claim 1, wherein generating procedural code from the function call includes concatenating a name of the parametric object onto a name of the procedural code and inserting the attribute into a parameter list of the procedural code.

9. A non-transitory computer-readable medium storing instructions, the instructions when executed by a processor cause the processor to:
receive an attribute for a formula of a parametric object, the formula using the attribute;
convert the received attribute and the formula from a first format to a second format corresponding to a function parameter of a design system;
draw the parametric object within a graphical user interface of the design system by calling a function corresponding to the function parameter of the design system and passing one or more of the converted attribute and the converted formula to the function as the function parameter;
generate procedural code from the function call, wherein generating procedural code comprises compiling at least one of (i) the attribute and (ii) the formula using the attribute, such that the procedural code, when executed, re-draws the parametric object within the graphical user interface of the design system using an updated attribute; and execute the procedural code using the updated attribute for each subsequent re-drawing of the parametric object within the graphical user interface of the design system.

10. The non-transitory computer-readable medium storing instructions of claim 9, wherein the instructions, when executed by a processor, cause the processor to use the updated attribute to determine a new appearance of the parametric object within the graphical user interface of the design system.

11. The non-transitory computer-readable medium storing instructions of claim 10, wherein the procedural code, when executed by a processor, causes the processor to execute a plurality of functions corresponding to an API of the design system.

12. The non-transitory computer-readable medium storing instructions of claim 11, wherein the instructions, when executed by a processor, cause the processor to translate the attribute and formula into a plurality of parameters corresponding to the API of the design system.

13. The non-transitory computer-readable medium storing instructions of claim 11, wherein the instructions, when executed by a processor, cause the processor to translate the formula of the object into a script variable that uses an inherited function of the API and translate an attribute of the parametric object into a parameter list for a function of the API.

14. The non-transitory computer-readable medium storing instructions of claim 9, wherein the instructions, when executed by a processor, cause the processor to generate procedural code from the function call by concatenating a name of the parametric object onto a name of the procedural code and inserting the attribute into a parameter list of the procedural code.

15. A system for generating procedural code from initial function calls, the initial function calls for drawing a parametric object within a graphical user interface of a design system and the parametric object including an attribute and a formula using the attribute, the system comprising:

a processing device, including:
a processor; and
memory, wherein one or more modules are stored in the memory and executed by the processor, the modules including:
a parametric object database interface module that interfaces with a parametric object database storing a plurality of parametric objects, each parametric object having an attribute and a formula describing graphic features of the parametric object;
a modeling module having an API defining a plurality of functions that graphically process the parametric objects according to the attributes and formulas of each parametric object; and
a formula parser module that generates procedural code from a plurality calls to the API functions, wherein the procedural code comprises at least one of (i) a compiled attribute and (ii) a compiled formula, such that the procedural code, when executed, re-draws the parametric object within the graphical user interface of the design system using an updated attribute.

16. The system of claim 15, further comprising a conversion module that changes the attributes and formulas from a first format to a second format, the second format corresponding to a parameter of an API function.

17. The system of claim 15, further comprising an input dialog module that receives an attribute for a formula of the parametric object.

18. The system of claim 17, wherein the modeling module graphically processes the parametric objects a first time by translating the parametric object formulas into a plurality of function calls corresponding to functions of the API and passing the received attribute to the plurality of functions as a function parameter.

19. The system of claim 18, wherein the formula parser module generates procedural code from the plurality of calls to the API functions by caching each function call.

20. The system of claim 17, wherein the modeling module graphically processes the parametric objects a second time by executing the cached function calls using an updated attribute.

* * * * *